United States Patent
Huang et al.

(10) Patent No.: US 8,550,148 B2
(45) Date of Patent: Oct. 8, 2013

(54) HEAT PLATE WITH CLIP

(75) Inventors: Yu-Po Huang, Kunshan (CN);
Tung-Jung Kuo, Kunshan (CN)

(73) Assignee: Kunshan Jue-Choung Electronics Co., Ltd., Kunshan, Jiangsu (CN)

( * ) Notice: Subject to any disclaimer, the term of this patent is extended or adjusted under 35 U.S.C. 154(b) by 419 days.

(21) Appl. No.: 12/923,874

(22) Filed: Oct. 13, 2010

(65) Prior Publication Data
US 2012/0090824 A1   Apr. 19, 2012

(51) Int. Cl.
*F28F 9/00* (2006.01)
*F28D 15/00* (2006.01)

(52) U.S. Cl.
USPC ........................................ 165/67; 165/104.26

(58) Field of Classification Search
USPC ...... 165/80.3, 104.21, 67, 68, 80.2; 257/727, 257/718, 719, 752; 24/455; 361/704, 707; 248/510
See application file for complete search history.

(56) References Cited

U.S. PATENT DOCUMENTS

| | | | | |
|---|---|---|---|---|
| 4,621,884 A * | 11/1986 | Berkebile et al. | ............ | 439/367 |
| 5,864,464 A * | 1/1999 | Lin | ................................ | 361/697 |
| 5,873,406 A * | 2/1999 | Horng | ......................... | 165/80.3 |
| 5,973,921 A * | 10/1999 | Lin | ................................ | 361/695 |
| 6,037,660 A * | 3/2000 | Liu | ................................ | 257/722 |
| 6,097,601 A * | 8/2000 | Lee | ................................ | 361/704 |
| 6,105,215 A * | 8/2000 | Lee | ................................ | 24/458 |
| 7,149,087 B2 * | 12/2006 | Wilson et al. | ................. | 361/699 |
| 7,952,878 B2 * | 5/2011 | Lian et al. | ...................... | 361/700 |

* cited by examiner

*Primary Examiner* — Tho V Duong
(74) *Attorney, Agent, or Firm* — Chun-Ming Shih; HDLS IPR Services

(57) ABSTRACT

A structure of heat plate with clip includes a heat plate and at least one clip. The heat plate is a hollow body having an interior cavity containing a capillary structure and a working fluid. The heat plate has a surface forming a receiving chamber. The clip is a resilient plate having mounting sections, which are mounted to the heat plate. The mounting sections have a portion received in the receiving chamber. In this way, replacement of inside-cavity supporting structure can be realized and advantages of thinned structure, flexible adjustment of positioning, and being hard to cause stress induced deformation can be achieved.

3 Claims, 10 Drawing Sheets

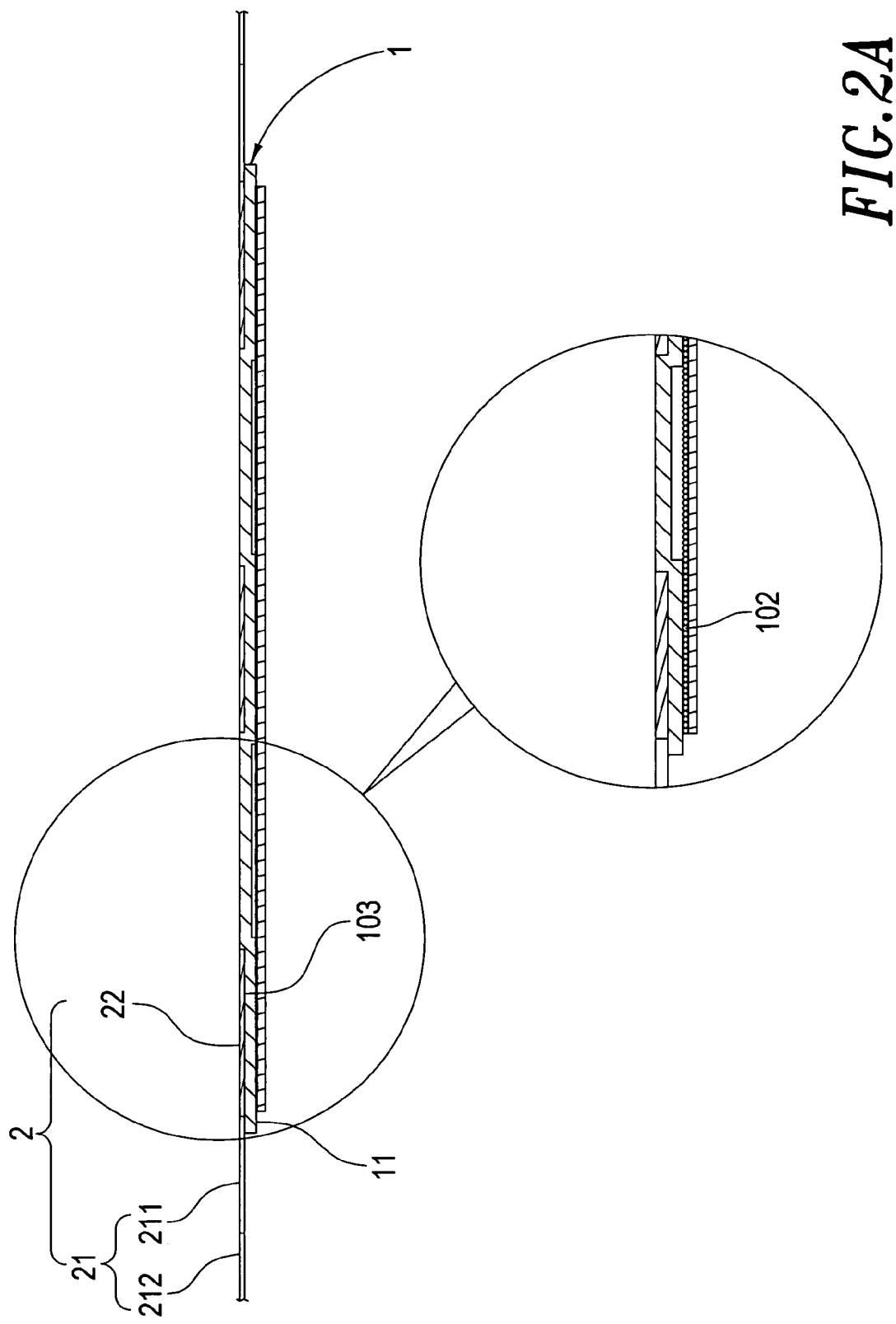

HEAT PLATE WITH CLIP

FIELD OF THE INVENTION

The present invention relates to a structure of heat plate, and in particular to a structure of heat plate that is combined with a clip and offers improved structural strength.

BACKGROUND OF THE INVENTION

A heat plates functions to remove heat from a heat generating element, which can be for example a central processing unit (CPU) or a graphics processing unit (GPU). The heat plate is often used in combination with a fan and heat dissipation fins.

Referring to FIG. 9, heretofore, to fix a heat plate 8 to a circuit board 3 that carries a heat generating element 4 and forms mounting holes 31, the heat plate 8 forms a plurality of openings 811 in edge flanges 81 thereof. The openings 811 are set corresponding to the mounting holes 31 to allow the use of fastener elements 812 for fixing. The mounting holes 31 are often arranged around the heat generating element 4, so that besides the openings 811 formed in the edge flanges 81 for coupling with the mounting holes 31 of the circuit board 3, the heat plate 8 can be positioned in such a way that a bottom surface of the heat plate 8 is laid flat on the heat generating element 4 to allow the heat generated by the heat generating element 4 to be transmitted to the heat plate 8 for dissipation to thereby achieve the purpose of heat dissipation for the heat generating element 4.

However, in the above described known structure, the heat plate is a hollow body (of which an inside surface carries a capillary structure) and the openings 811 are formed in the heat plate 8. The fastening forces generated by the fastener elements 812 will directly act on the heat plate 8, leading to stress induced deformation during the process of heat transfer and thus lowering the performance of heat dissipation. Thus, it is often that a supporting structure is arranged inside the cavity of the heat plate to improve resistance against compression and this complicates the manufacturing process.

Further, the conventional heat plate 8 must provide an additional portion of the edge flanges 81 for forming the openings 811 at locations corresponding to the heat generating element 4 mounted on the circuit board 3 and the mounting holes 31 formed around the heat generating element. Further, each particular set of heat plate mold can only match a specific heat generating element, so that there is a need for preparing a plurality of various heat plate molds for making heat plates for different heat generating elements. This leads to an increase of the costs.

Thus, it is desired to provide a solution to overcome the above problems.

SUMMARY OF THE INVENTION

An objective of the present invention is to provide a structure of heat plate with clip, wherein through a unique structural arrange of a clip and a heat plate, replacement of the inside-cavity supporting structure can be realized and advantages of thinned structure and being hard to cause stress induced deformation can be achieved.

Another objective of the present invention is to provide a structure of heat plate with clip, wherein flexible selection of the location where the clip is mounted to the heat plate according to the locations of the mounting holes defined in the circuit board, the mounting location of the clip can be flexibly adjusted and an advantage of reducing costs can be achieved.

To achieve the above objectives, according to the present invention, a structure of heat plate with clip is provided, comprising a heat plate and a clip.

The heat plate comprises a plurality of edge flanges, and the heat plate has a surface forming a receiving chamber. The clip comprises a resilient plate, which has at least one mounting section. The at least one mounting section is mounted to at least one edge flange of the heat plate and a portion of the mounting section is received in the receiving chamber. As such, advantages of increase of heat dissipation area, reinforcement of structural strength, and being hard to cause stress induced deformation can be achieved.

In another aspect of the present invention, a structure of heat plate with clip is provided, wherein the heat plate have an edge flange forming an extension, which has a length greater than length of the mounting sections. The at least one mounting section being selectively mounted to the extension of at least one edge flange of the heat plate. As such, the mounting location of the clip is flexibly adjustable and an advantage of reducing costs is realized.

BRIEF DESCRIPTION OF THE DRAWINGS

The present invention will be apparent to those skilled in the art by reading the following description of preferred embodiments thereof with reference to the drawings, in which:

FIG. 2A is a cross-sectional view of the first embodiment of the present invention taken along line A-A of FIG. 2;

DETAILED DESCRIPTION OF THE PREFERRED EMBODIMENTS

Figure 1:
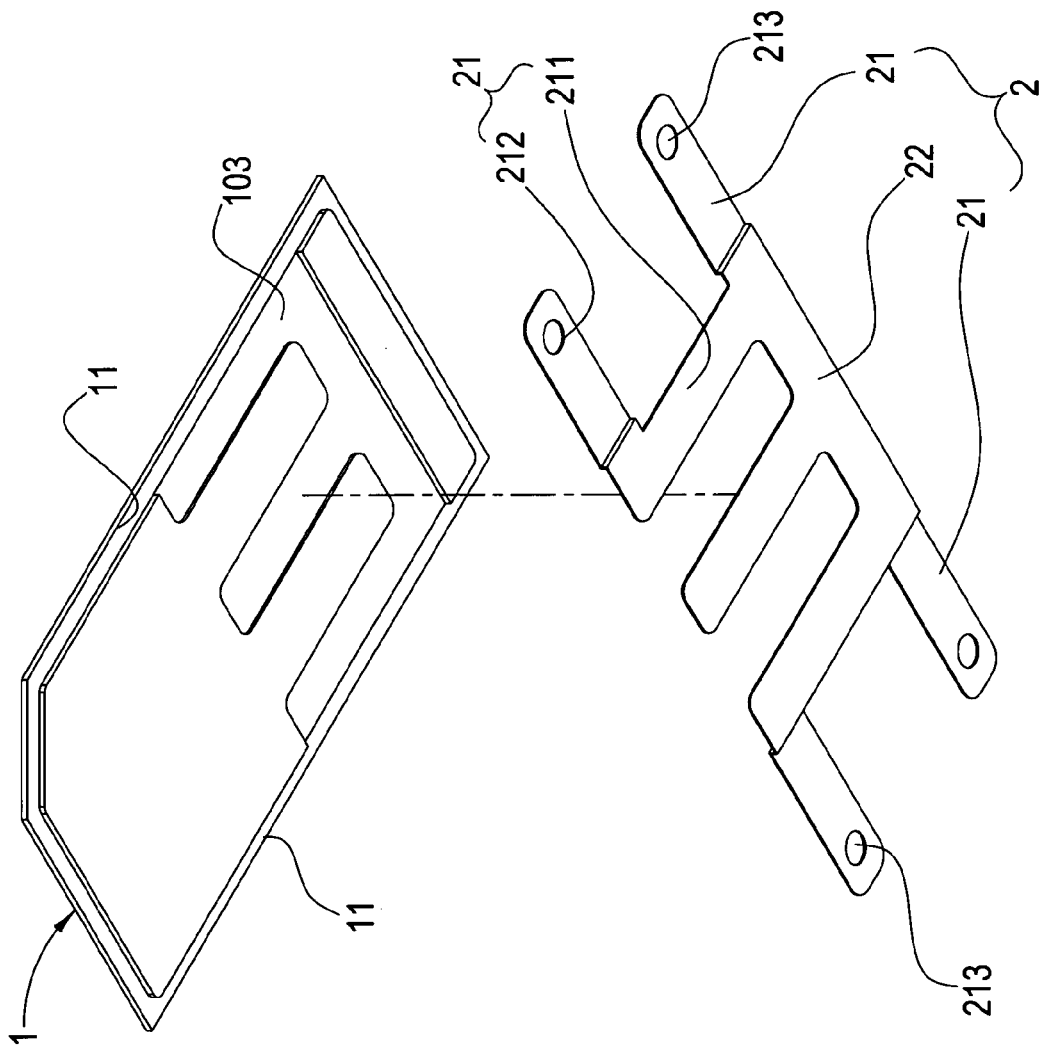
FIG. 1 is a perspective view showing a first embodiment of the present invention before being assembled.
Figure 2:
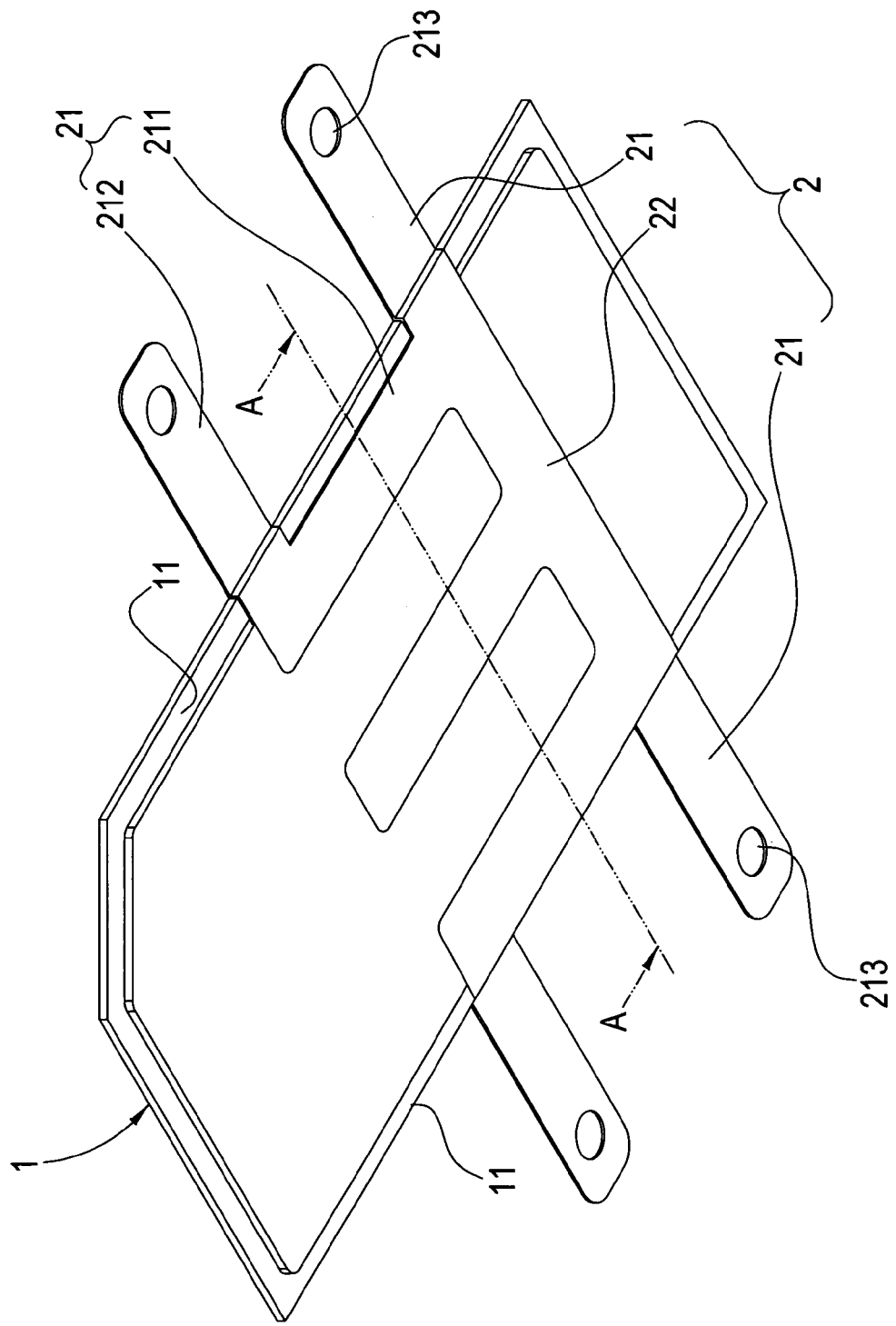
FIG. 2 is a perspective view showing the first embodiment of the present invention after being assembled.
Figure 3:
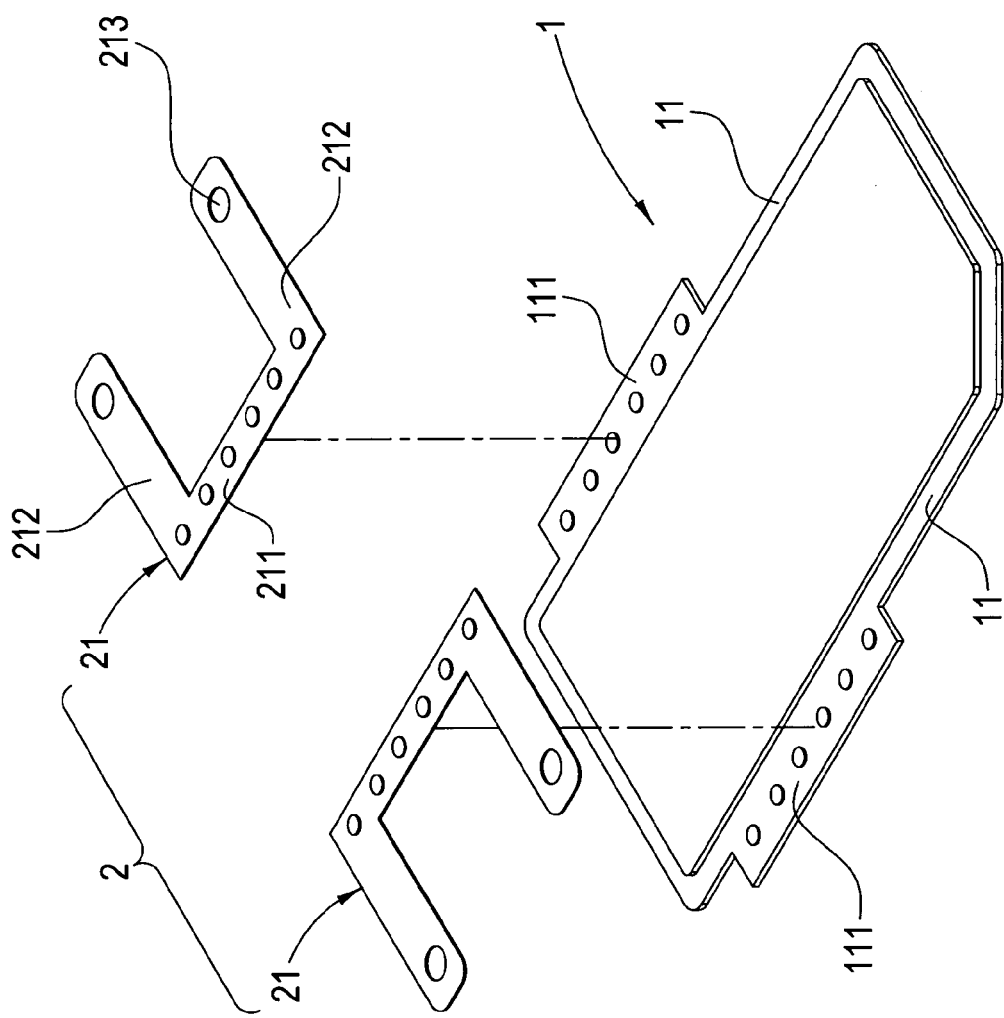
FIG. 3 is a perspective view showing a second embodiment of the present invention before being assembled.
Figure 4:
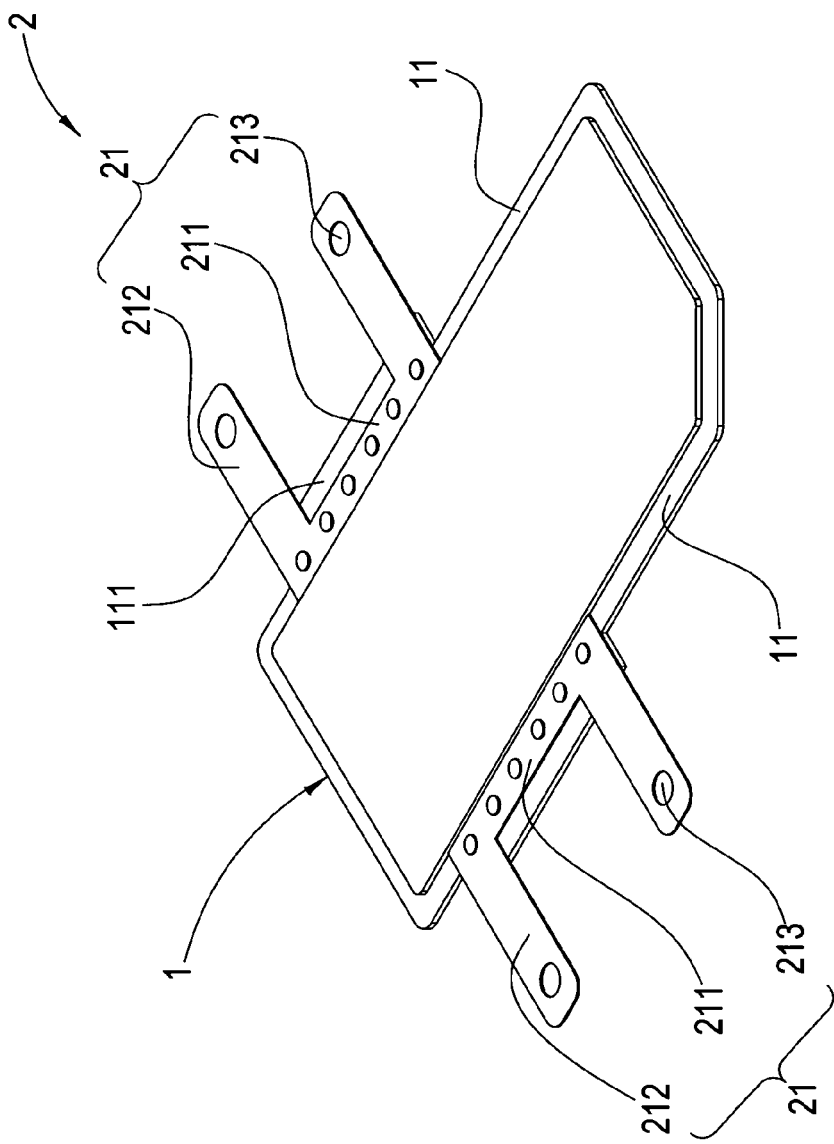
FIG. 4 is a perspective view of the second embodiment of the present invention, taken from an opposite side, after being assembled.
Figure 5:
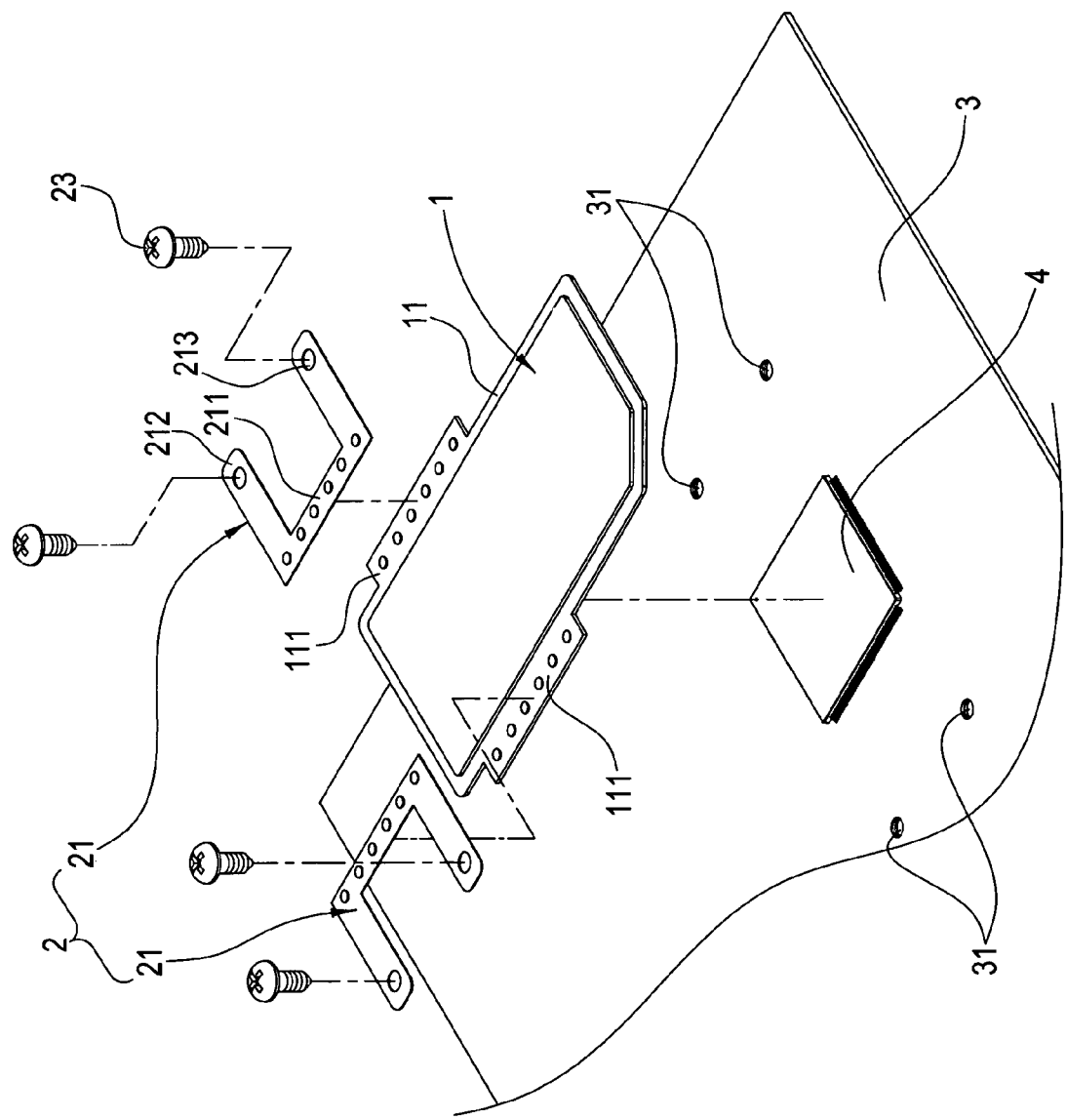
FIGS. 5 and 6 demonstrate an application of the second embodiment of the present invention.
Figure 6:
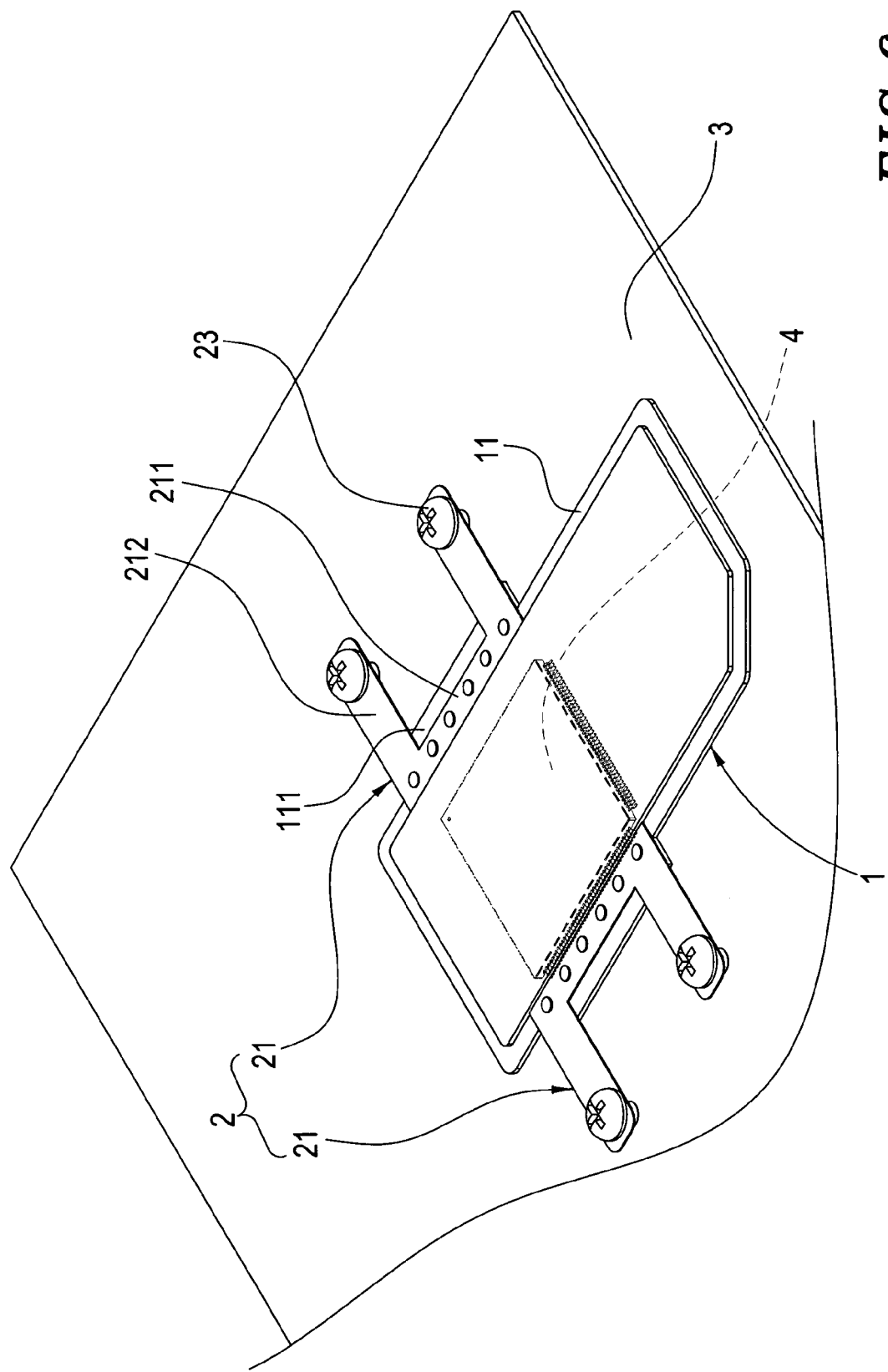
Figure 7:
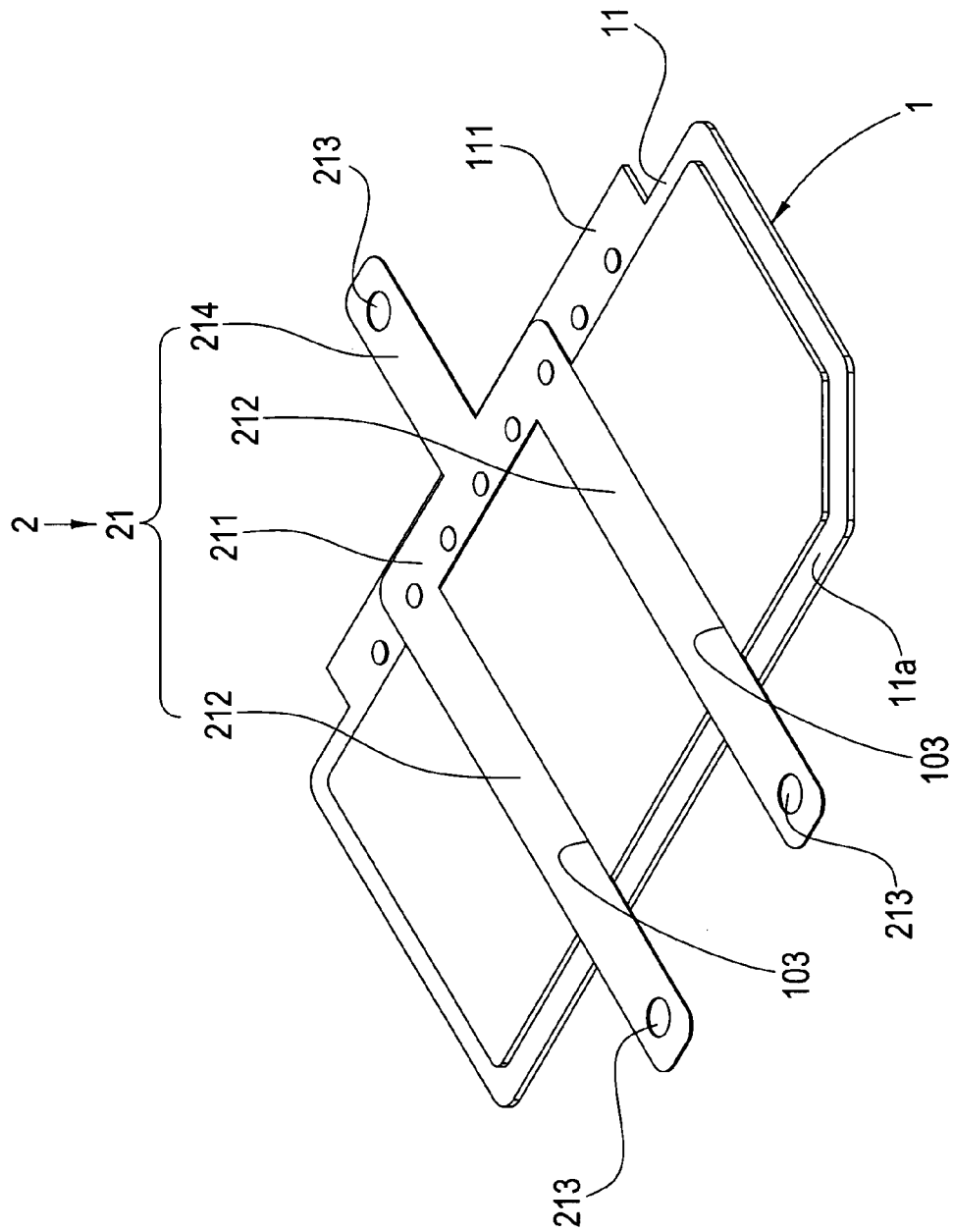
FIG. 7 is a perspective view showing a third embodiment of the present invention after being assembled.
Figure 8:
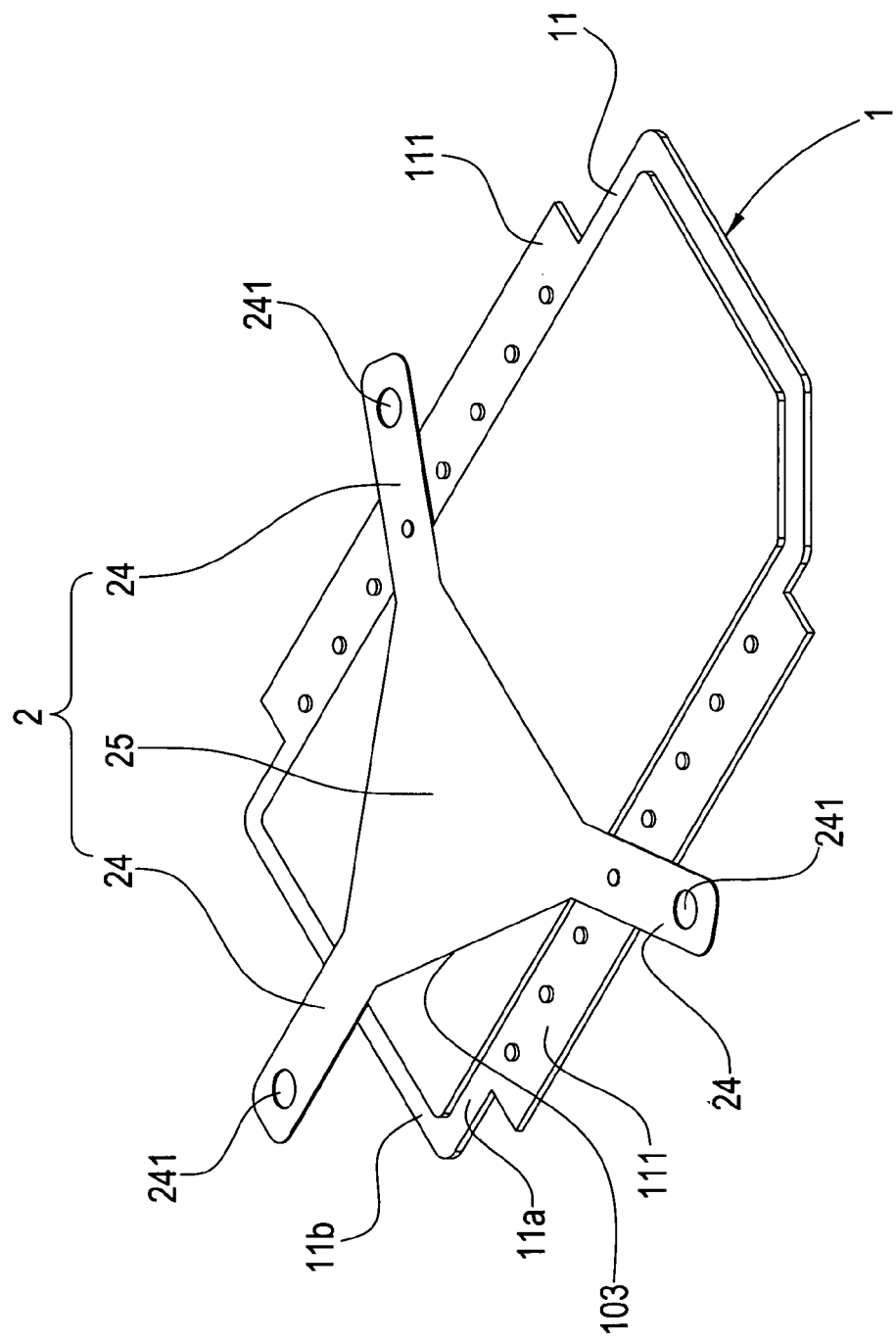
FIG. 8 is a perspective view showing a fourth embodiment of the present invention after being assembled.
Figure 9:
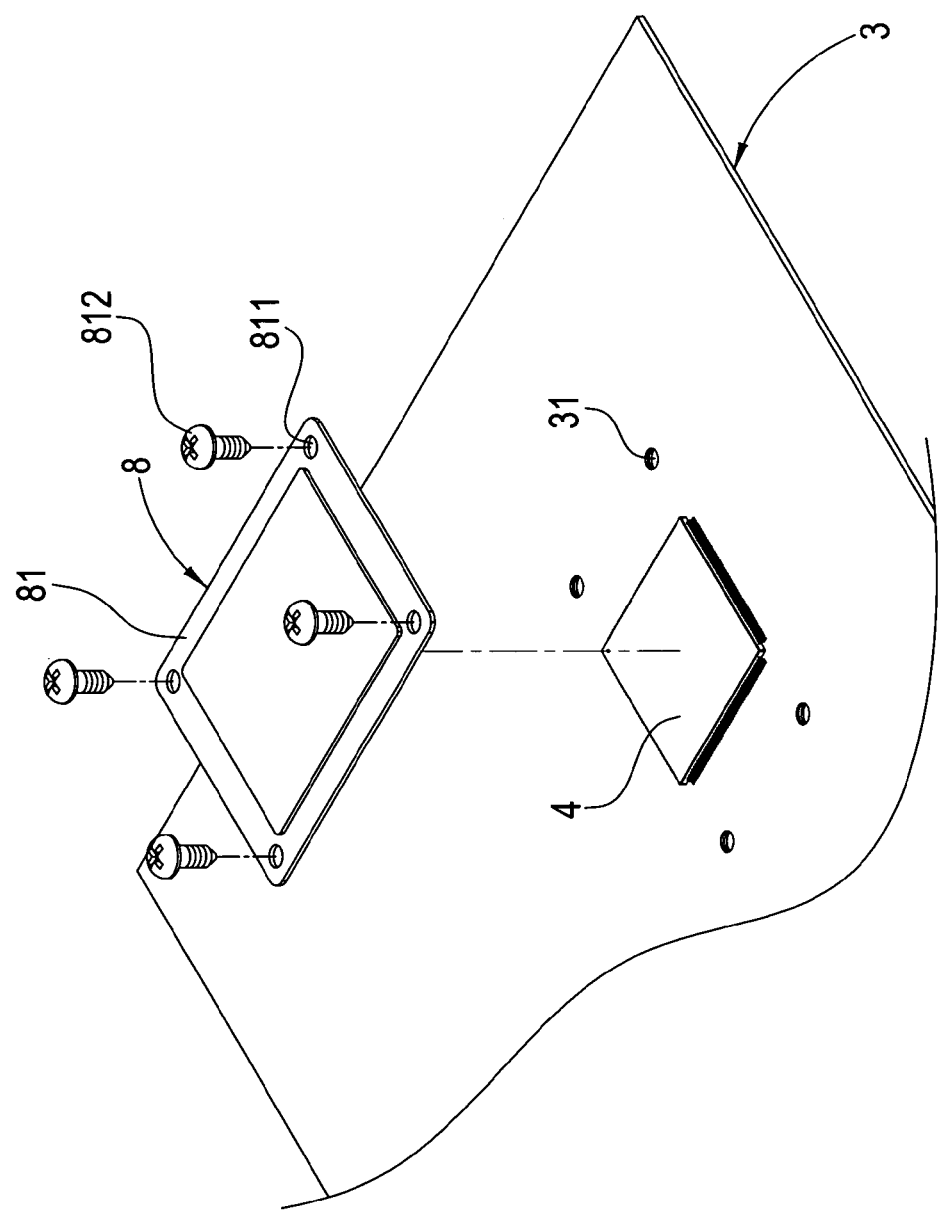
FIG. 9 is a perspective view showing an application of a conventional heat plate.

The present invention provide a structure of heat plate with clip, which is used to dissipate heat generated by a heat generating element, and a first embodiment of the heat plate with clip according to the present invention is shown in FIGS. 1 and 2, a second embodiment shown in FIGS. 3-6, and third and fourth embodiments respectively shown in FIGS. 7 and 8. Detailed descriptions of these embodiments will be given as follows.

First Embodiment

Referring to FIGS. 1, 2, and 2A, the structure of heat plate with clip according to the present invention comprises a heat plate 1 and a clip 2. The heat plate 1 is in the form of a hollow body having an internal cavity containing therein a capillary structure 102 and the working fluid.

The heat plate 1 comprises a plurality of edge flanges 11, and the heat plate 1 has a surface forming a receiving chamber 103 that is defined by a wall surface that is recessed inward with respect to the hollow cavity to combine with the capillary structure 102 to form a supporting structure.

The clip 2 comprises a thin resilient sheet made of for example ferrous alloy, copper alloys, or stainless steels. The clip 2 comprises two mounting sections 21 (a plurality of holes 213 being formed in the mounting sections 21 of the clip 2 for mounting purposes), and each of the mounting sections 21 is composed of a beam 211 and a plurality of projection arms 212. The beams 211 of the two mounting sections 21 are respectively mounted to two opposite ones of the edge flanges 11 of the heat plate 1. The beam 211 of each of the mounting sections 21 has a lengthwise edge and the projection arms 212 project outward from the lengthwise edge of the beam 211 (such as inclinedly projecting or laterally projecting, laterally projecting being taken as an example illustrated in the drawings). Each of the projection arms 212 forms the holes 213. Coupling between each of the mounting sections 21 and the heat plate 1 can be done with soldering, riveting, or combination of soldering and riveting. Soldering is taken as an example illustrated in the drawings.

The clip 2 further comprises a positioning section 22 connecting between the two mounting sections 21. Specifically, the positioning section 22 is arranged to connect between the beams 211 of the two mounting sections 21, and the positioning section 22 is mounted to a top surface or a bottom surface of the heat plate 1 to be received in the receiving chamber 103 (the positioning section 22 of the clip 2 being of an E-shaped configuration in the embodiment illustrated) in such a way that the total height of the combination of the positioning section 22 received in the receiving chamber 103 is smaller than the sum of the thicknesses of the heat plate 1 and the clip 2. In the embodiment illustrated, the positioning section is mounted to the bottom to provide the best bonding strength between the clip 2 and the heat plate 1.

Referring to FIG. 2A, which is a cross-sectional view taken along line A-A of FIG. 2, with portions of the mounting sections 21 and the positioning section 22 are received in the receiving chamber 103, the interior of the heat plate 1 is provided with structural support to improve the structural strength thereof.

Second Embodiment

Referring to FIGS. 3-6, a structure of heat plate with clip according to the second embodiment of the present invention comprises a heat plate 1 and a clip 2, in which the heat plate 1 comprises a hollow body having an interior cavity.

The heat plate 1 has a plurality of edge flanges 11, and preferably, an extension 111 laterally extends from each of two opposite ones of the edge flanges 11 as shown in the drawings.

The clip 2 comprises a thin resilient sheet made of for example ferrous alloy, copper alloys, or stainless steels. The clip 2 comprises two mounting sections 21 each forming a plurality of holes 213. Each of the mounting sections 21 is mounted to a corresponding one of the edge flanges 11 of the heat plate 1 and is preferably also mounted to a corresponding one of the extensions 111 to ensure improved bonding strength. Coupling between each of the mounting sections 21 and the heat plate 1 can be done with soldering, riveting, or combination of soldering and riveting. Riveting is taken as an example illustrated in the drawings.

Each of the mounting sections 21 is composed of a beam 211 and a plurality of projection arms 212. The beams 211 of the two mounting sections 21 are respectively mounted to the extensions 111 of the two opposite edge flanges 11 of the heat plate 1. (It is apparent that the beams can be respectively mounted to both the edge flanges 11 and the extensions 111 of the edge flanges 11.) The beam 211 of each of the mounting sections 21 has a lengthwise edge and the projection arms 212 project outward from the lengthwise edge of the beam 211 (such as inclinedly projecting or laterally projecting, laterally projecting being taken as an example illustrated in the drawings). Each of the projection arms 212 further comprises a fastening structure to correspond to a circuit board 3 (or a substrate) carrying the heat generating element 4, as shown in FIG. 5. In the embodiment illustrated, the fastening structure are holes 213 for receiving and holding fastener elements 23 (such as screws) and corresponding in position to mounting holes 31 defined in the circuit board 3. It is apparent that the fastening structure can alternatively be projections that have inner-threaded holes or pawl-like structures.

Referring to FIGS. 5 and 6, a circuit board 3 is shown. The circuit board 3 carries thereon a heat generating element 4 and two sets of mounting holes 31. The mounting holes 31 are arranged in peripheral areas around the heat generating element 4. In the structure of heat plate according to the present invention, the heat plate 1 is provided for being laid flat on the heat generating element 4, as shown in FIGS. 5 and 6, in which a flat bottom surface of the heat plate is positioned flat on the heat generating element 4. Afterwards, the mounting sections 21 of the clip 2 are mounted to the extensions 111 of the edge flanges 11 of the heat plate 1 through the beams 211 thereof. (It is apparent that the mounting can be made to both the edge flanges 11 and the extensions 111 of the edge flanges 11, and for simplification of the description, such an alternative manner of mounting, which is applicable to other embodiments of the present invention, will not be repeatedly described hereinafter.) Finally, the fastener elements 23 fix the holes 213 and the mounting holes 31, which are set overlapping each other, together to securely fix the heat plate 1 on the circuit board 3 with the heat generating element 4 properly interposed between the heat plate 1 and the circuit board 3, whereby the heat generated by the heat generating element 4 can be transferred to the heat plate 1 for dissipation. Since the holes 213 that are provided for mounting purposes are formed in the clip 2, rather than in the heat plate 1, the fastening forces applied by the fastener elements 23 do not directly act on the heat plate 1, and are instead transmitted through the clip 2 to the receiving chamber 103 of the heat plate 1 that provides a function of supporting, so the heat plate 1 will not undergo deformation during the transmission of the force and the performance of heat dissipation can be maintained.

Certainly, if the extension 111 has a length greater than that of the corresponding beam 211, positioning of the clip 2 for mounting the mounting sections 21 to the extension 111 of the respective edge flange of the heat plate 1 can be adjusted according to the locations of the mounting holes 31. In other words, the beam 211 can be coupled to any desired portion of the extension 111 (namely showing an arbitrary coupling or mounting position). It is certain that such a portion must be selected to correspond in position to at least one set of the mounting holes 31 in order to allow the holes 213 of the mounting sections 21 to align with the mounting holes 31 for being fixed by the fastener elements 23. As such, heat plates 1 made of a single mold are applicable to heat generating elements 4 of different specifications, and there is no need to provide various heat plate molds for making heat plates for different heat generating elements 4. Costs can thus be significantly reduced and such costs include at least the expense of molds and the costs of materials, which are reduced due to the clip 2 according to the present invention being made thinner than the conventional ones and selectively made of ferrous alloys, copper alloys, or stainless steels.

Third Embodiment

Referring to FIG. 7, a structure of heat plate with clip according to a third embodiment of the present invention comprises a heat plate 1, which is similar to the counterpart heat plate of the first embodiment described above, except that the heat plate 1 of the third embodiment has an edge flange 11 from which an extension 111 projects outward. The third embodiment comprises a clip 2 that has a single mounting section 21, which is similar to a single one of the mounting sections 21 of the second embodiment, with a difference residing in that the mounting section 21 of the third embodiment is mounted to the extension 111 of the heat plate 1.

As shown, the clip 2 according to the third embodiment comprises a mounting section 21, which is composed of a beam 211 and a plurality of projection arms 212, 214. The beam 211 is mounted to an edge flange 11 of the heat plate 1. The beam 211 has two opposite lengthwise edges from which the projection arms 212, 214 extend in opposite direction. As shown, one of the lengthwise edges forms two projection arms 212 extending therefrom and the projection arms 212 are partly received in a receiving chamber in such a way that the total height of the combination of the projection arms 212 received in the receiving chamber is smaller than the sum of the thicknesses of the heat plate and the clip; the opposite one of the lengthwise edges forms a single projection arm 214 extending therefrom.

Preferably, the edge flange 11 of the heat plate 1 further forms an extension 111 projecting sideways therefrom, whereby the clip 2 may be selectively mounted, with the beam 211 thereof, to any portion of the extension 111 to provide the mounting of the clip 2 to the heat plate 1 with flexible adjustability. Coupling between the beam 211 and the extension 111 can be done with soldering, riveting, or combination of soldering and riveting. Riveting is taken as an example illustrated in the drawings.

Fourth Embodiment

Referring to FIG. 8, a structure of heat plate according to a fourth embodiment of the present invention comprises a heat plate 1, which is similar to the counterpart heat plate of the third embodiment, with a difference in that the heat plate 1 of the fourth embodiment comprises two opposite edge flanges 11 from each of which an extension 111 projects sideways, and a clip 2 that is of a structure having three mounting sections 24.

As shown, the clip 2 comprises three mounting sections 24 and a positioning section 25 connecting among the three mounting sections 24. The positioning section 25 is received in a receiving chamber 103 defined in the heat plate 1 in such a way that the total height of the combination of the positioning section 25 received in the receiving chamber is smaller than the sum of the thicknesses of the heat plate 1 and the clip 2. Each of the mounting sections 24 has an end mounted to a corresponding edge flanges 11, 11a, 11b of the heat plate 1 and an opposite end that forms a hole 241.

Preferably, the two edge flanges 11, 11a of the heat plate 1 respectively form extensions 111 projecting sideways therefrom and the extensions 111 have a length greater than a width of each of the mounting sections 24, whereby two of the mounting sections 24 of the clip 2 are allowed to selectively mount to any portions of the extensions 111 with the ends thereof to provide the mounting of the clip 2 to the heat plate 1 with flexible adjustability. Coupling between the mounting sections 24 and the extensions 111 can be done with soldering, riveting, or combination of soldering and riveting. Riveting is taken as an example illustrated in the drawings.

The structure of heat plate with clip according to the present invention offers the following advantages: With a clip 2 coupled to the heat plate 1 and a receiving chamber 103 being provided for receiving the clip 2, besides functioning as a replacement for inside-cavity support structure of the heat plate 1 and showing a thinned configuration, due to the holes 213, 241 that are provided for mounting purposes being formed in the clip 2, rather than in the heat plate 1, fastening forces generated by the fastener elements 23 do not directly act on the heat plate 1, so that the heat plate 1 does not easily undergo stress induced deformation during the process of heat transfer and the performance of heat dissipation can be maintained. Through mounting of the extension 111 of the heat plate 1 to the mounting sections 21, 24, the coupling between the clip 2 and the heat plate 1 shows flexible adjustability of the mounting position therebetween so that heat plates made with a single mold are applicable to heat generating elements 4 of various specifications. Thus, there is no need to provide various heat plate molds for making heat plates for different heat generating elements 4. An advantage of significantly reducing costs can be realized.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A heat plate structure, comprising:
a heat plate, which has a plurality of edge flanges, the heat plate having a surface forming a receiving chamber recessed from the surface to combine with a capillary structure disposed in a hollow space that is formed within the heat plate to form a supporting structure; and
a clip, which is made of a resilient plate having two mounting sections and an E-shaped positioning section connecting between the two mounting sections, the positioning section being engaged in the receiving chamber, each mounting section being mounted to at least one of the edge flanges of the heat plate and having a plurality of prosection arms extended from one side of the E-shaped positioning section.

2. The heat plate structure as claimed in claim 1, wherein the clip is coupled to the heat plate through one of soldering, riveting, and combination of soldering and riveting.

3. The heat plate structure as claimed in claim 1, wherein the mounting section of the clip comprises a plurality of fastening structures corresponding to a circuit board of a heat generating element.

* * * * *